United States Patent [19]

Matsuura

[11] Patent Number: 5,889,280
[45] Date of Patent: Mar. 30, 1999

[54] APPARATUS FOR MEASURING DISPLACEMENT

[75] Inventor: Tatsuhiko Matsuura, Osaka, Japan

[73] Assignee: Mitutoyo Corporation, Kanagawa, Japan

[21] Appl. No.: 786,672

[22] Filed: Jan. 21, 1997

[30] Foreign Application Priority Data

Jan. 23, 1996 [JP] Japan .................................. 8-028597

[51] Int. Cl.$^6$ .......................... G01B 11/00; G01D 5/347; G02B 5/18

[52] U.S. Cl. ................. 250/237 G; 250/231.16; 356/356; 356/373; 257/569; 33/707

[58] Field of Search .................... 250/237 G, 231.16, 250/231.18, 231.14, 231.13, 208.2, 216; 356/356, 363, 373, 345, 374, 375; 359/566, 569, 575; 33/707, 706; 341/13, 31

[56] References Cited

U.S. PATENT DOCUMENTS

| | | |
|---|---|---|
| 4,782,229 | 11/1988 | Ernst .................................. 250/237 G |
| 5,068,530 | 11/1991 | Ieki et al. ............................. 250/237 G |
| 5,572,019 | 11/1996 | Sakuma .............................. 250/237 G |
| 5,574,559 | 11/1996 | Kaneda et al. ...................... 250/237 G |
| 5,576,537 | 11/1996 | Holzapfel et al. ................... 250/237 G |
| 5,604,345 | 2/1997 | Matsuura ............................. 250/237 G |
| 5,657,125 | 8/1997 | Kato et al. .......................... 250/237 G |
| 5,748,373 | 5/1998 | Hane et al. .......................... 250/237 G |
| 5,750,984 | 5/1998 | Ieki .................................... 250/231.16 |
| 5,774,219 | 6/1998 | Matsuura ............................. 250/237 G |

FOREIGN PATENT DOCUMENTS

1063060  8/1964  United Kingdom .

Primary Examiner—Edward P. Westin
Assistant Examiner—John R. Lee
Attorney, Agent, or Firm—Webb Ziesenheim Bruening Logsdon Orkin & Hanson, P.C.

[57] ABSTRACT

A transmission type encoder is disclosed, which comprises a main scale, a light source that radiates collimated light to the main scale, and a photodiode array that also functions as an index scale. The main scale has a rectangular grating in which light transmitting portions and light non-transmitting portions are arranged at pitch P, and each width of the light transmitting portions is set to 2p/3, whereby a third harmonic distortion in an output signal can be removed.

13 Claims, 5 Drawing Sheets

APPARATUS FOR MEASURING DISPLACEMENT

BACKGROUND OF THE INVENTION (1) Field of the Invention

The present invention relates to an apparatus for measuring an amount of relative movement of a first member and a second member that are oppositely disposed so as to be relatively movable using an optical signal, an electric signal, or a magnetic signal.

(2) Prior Art

Conventionally, an optical encoder has a main scale on which a grating is formed. The grating is composed of light transmitting portions and light non-transmitting portions (or light reflecting portions and light non-reflecting portions) that are arranged at a predetermined pitch in such a manner that the ratio of the widths thereof is 1:1. Such a grating that each of the light transmitting portions or light reflecting portions has a rectangular pattern is, hereinafter, referred to a "rectangular grating". In a light transmission-type optical encoder, collimated light is radiated to such a main scale. The transmitted light of a rectangular pattern is emitted to an index scale having a rectangular grating which is composed of light transmitting portions and light non-transmitting portions that are arranged at a predetermined pitch. By detecting a bright/dark pattern of the transmitted light of the index scale that is modulated by the relative movement of the main scale and the index scale, a displacement signal that periodically varies can be obtained. By processing the displacement signal, the amount of displacement, namely the distance, can be measured.

The displacement signal obtained by the above-described optical encoder is theoretically a triangular wave that corresponds to the variation of the overlap of the scale gratings. However, in reality, due to an influence of diffraction of light or the like, a pseudo sine wave signal is obtained. The pseudo sine wave has too large harmonic distortions to treat as a sign wave. The harmonic distortions restrict the detection accuracy and resolution. In particular, when the grating pitch of the scales are as small as several ten μm, It is known that the fluctuation of the gap between the main scale and the index scale becomes large and that even small gap fluctuation on the order of several ten am causes the distortion component to largely vary. Thus, it will be difficult to adjust the gap.

To solve such a problem, so far, several methods for reducing the harmonic distortions of the above-described optical encoder have been proposed. For example, (1) method using a sine wave grating of which each of the light transmitting portions of the index scale is formed in a sine wave shape (for example, U.S. Pat. No. 4,782,229), (2) method using a pair of rectangular gratings that have different phases for canceling odd order harmonic distortions (for example, Japanese Patent Laid Open Publication 3-48122), and (3) method setting the ratio of the widths of light transmitting portions and light non-transmitting portions of the index scale so as to cancel the harmonic distortions (for example, Japanese Patent Laid Open Publication 7-146160).

However, in the methods (1) to (3), only the index scale grating on the light receiving side is modified so as to reduce the harmonic distortions. Thus, the main scale is not modified. The transmitted light amount is restricted by the main scale. In particular, in the case that the method for detecting a bright/dark pattern of geometrical light is used, when the scale grating is finely formed, it is difficult to remove the influence of diffracted light and adjust the gap. Thus, a satisfactory S/N ratio cannot be obtained. In addition, in the method (1), it is difficult to finely form the scale gratings in comparison with the method using the rectangular grating.

This problem also applies to an electrostatic capacitance type encoder that detects the variation of a transferred pattern of an electric signal with electrostatic capacity coupling between electrodes of the scales and to a magnetic encoder that measures the displacement with magnetic coupling between the scales as well as the optical encoder. For example, in the electrostatic capacitance type encoder, due to an influence of an edge effect that cannot be represented by parallel plates, the wave distortion varies corresponding to the gap.

SUMMARY OF THE INVENTION

An object of the present invention is to provide a displacement measuring apparatus having a combination of rectangular gratings so as to accurately obtain a displacement signal with a small harmonic distortion, a small influence of gap fluctuation, and an improved S/N ratio.

According to a first aspect of the present invention, an apparatus for measuring a displacement comprises a first member on which a first grating is formed, said first grating being composed of light transferring portions and light non-transferring portions which are alternately arranged with rectangular patterns at pitch P, each width of said light transferring portions in a direction of a grating arrangement being set to m×P/3 ( where m is 1 or 2), light radiating means for radiating a collimated light to said first member so as to obtain a rectangular transferred light pattern, a second member on which a second grating is formed, said second member being disposed opposite to said first member with a gap so as to be relatively movable in the direction of the grating arrangement along with said light radiating means, said second grating being composed of light transmitting portions and light non-transmitting portions which are alternately arranged with rectangular patterns so as to modulate said transferred light from said first member to output a transmitted light pattern, and light receiving means for receiving said transmitted light pattern from said second member and outputting a displacement output signal that varies corresponding to the relative movement of said first and second members.

According to a second aspect of the present invention, an apparatus for measuring a displacement comprises a scale on which a grating is formed, said grating being composed of light transferring portions and light non-transferring portions which are alternately arranged with rectangular patterns at pitch P, each width of said light transferring portions in a direction of a grating arrangement being set to m×P/3 (where m is 1 or 2), light radiating device for radiating a collimated light to said scale so as to obtain a rectangular transferred light pattern, and a light receiving device array for receiving the transferred light pattern from said scale, said light receiving device array having a plurality of light receiving devices which are arranged at pitch 3×P/4 so as to output four phase displacement output signals.

According to a third aspect of the present invention, an apparatus for measuring a displacement comprises first and second members oppositely disposed so as to be relatively movable, a signal transferring device disposed on said first member for transferring a signal with a rectangular pattern to said second member, said signal transferring device having a rectangular grating composed of signal transferring portions and non-transferring portions alternately arranged with rectangular patterns at a pitch P, each width of said signal transferring portions in a direction of a grating arrangement being set to 2×P/3, and a signal receiving device disposed on said second member for receiving a transferred signal from said first member and outputting a displacement output signal that varies corresponding to the relative movement of said first and second members.

In the displacement measuring apparatus of the present invention, the first member is a main scale having a rectangular grating. The rectangular grating is composed of signal transferring portions and signal non-transferring portions which are arranged at a predetermined pitch. In the case of an optical encoder, the signal transferring portion transmits or reflects an optical pattern. In the case of a capacitance type encoder, the signal transferring portion is an electric signal transferring portion that uses capacitance coupling. In the case of a magnetic encoder, the signal transferring portion is a magnetic signal transferring portion that uses magnetic coupling.

In the present invention, with respect to the rectangular grating of the main scale, each of the width of the signal transferring portions is set to 2×P/3 or P/3. As a result, a third order harmonic component in the signal pattern transferred from the first member to the second member is removed, whereby displacement output signals can be output as a preferable pseudo sine wave signal.

When the present invention is applied to a transmission-type optical encoder, the first member is a transmission type main scale of which light transmitting portions and light non-transmitting portions are disposed as light transferring portions and light non-transferring portions at pitch P and preferably each width of the light transmitting portions is set to 2P/3. The second member is an index scale of which the ratio of the widths of light transmitting portions and light non-transmitting portions is 1:1 and disposed at pitch P. Thus, the transmitted light amount of the main scale increases in comparison with the case that the main scale is a rectangular grating of which the ratio of the widths of the light transmitting portions and the light non-transmitting portions is 1:1. Thus, the peak value of the received light amount of the light receiving portion increases, thereby improving the S/N ratio. In addition, since the width of the light transmitting portions of the main scale is large, the geometrical light component of the bright/dark pattern relatively becomes larger than the component of the interference fringe pattern due to diffraction of light. Therefore, in a system that detects a geometric light pattern, the influence of gap fluctuation decreases, thereby improving the S/N ratio. Moreover, since the received light amount increases, a response speed rises. When the bias of the light receiving device is raised, the response speed can be further increased.

In such a system that a light receiving device array is used for serving as the index scale, a plurality of light receiving devices are arranged at pitch 3×P/4 so as to output four phase displacement output signals.

In the case of a reflection-type optical encoder, the light transferring portions and the light non-transferring portions of the main scale become light reflecting portions and light non-reflecting portions, respectively. Each width of the light reflecting portions is preferably set to 2P/3. Thus, the same effects as the above-described light transmission-type encoder can be obtained.

These and other objects, features and advantages of the present invention will become more apparent in light of the following detailed description of best mode embodiments thereof, as illustrated in the accompanying drawings.

DETAILED DESCRIPTION OF THE PREFERRED EMBODIMENTS

Next, with reference to the accompanying drawings, embodiments of the present invention will be described.

Figure 1:
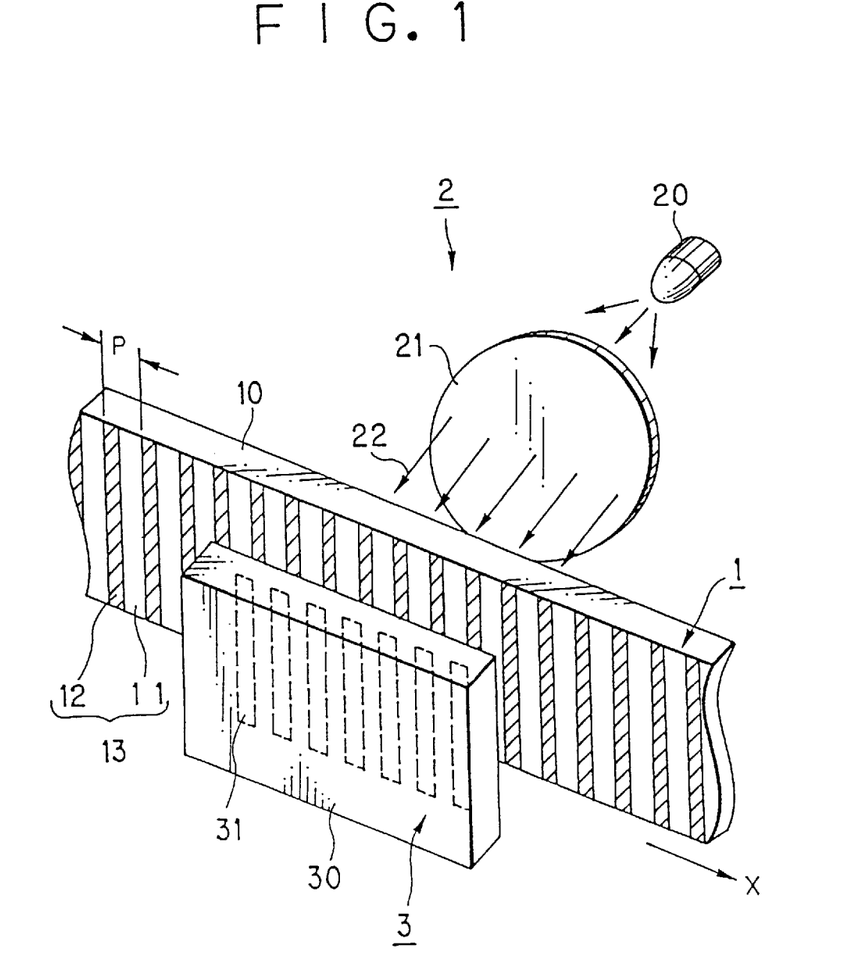
FIG. 1 is a perspective view showing the structure of a transmission-type encoder according to an embodiment of the present invention.
Figure 2:
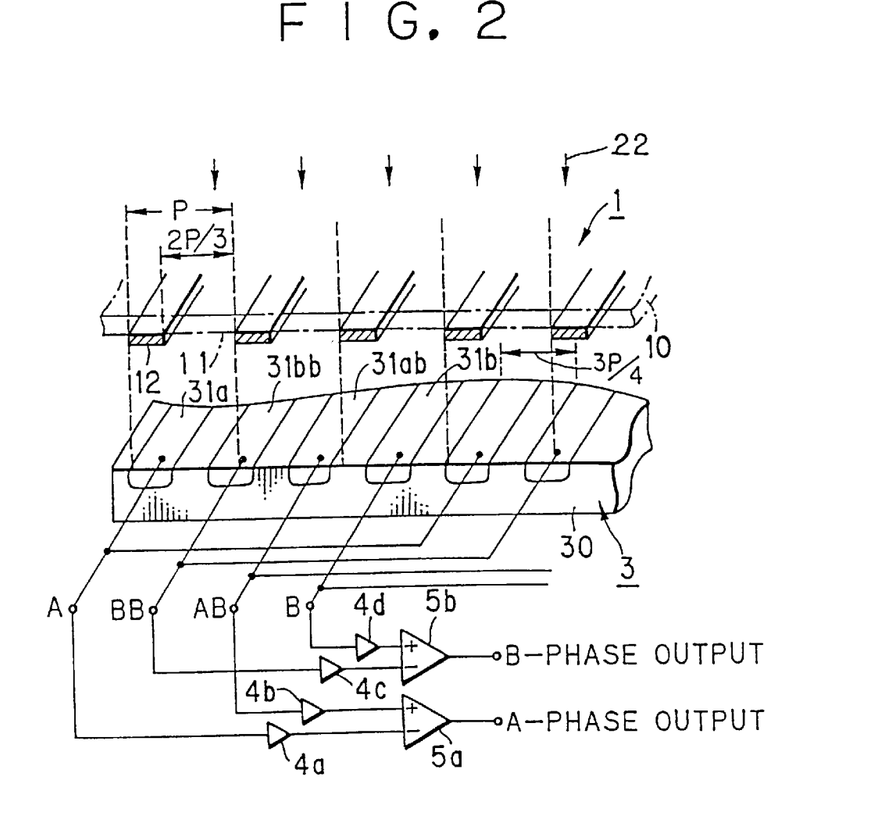
FIG. 2 is an enlarged view showing the structure of principal portions of the encoder according to the embodiment.
Figure 3:
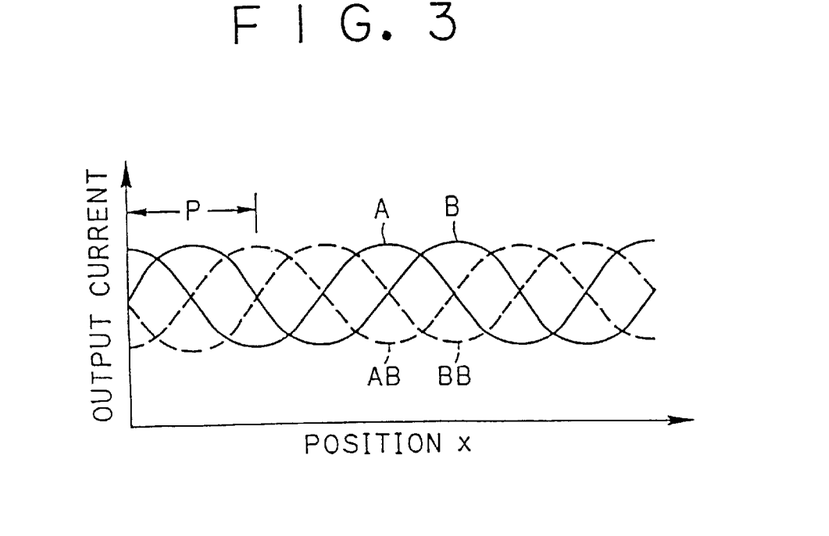
FIG. 3 is a graph showing an output current waveform of the encoder according to the embodiment.

FIG. 1 is a perspective view showing an outlined structure of a transmission-type optical encoder according to an embodiment of the present invention. FIG. 2 is an enlarged view showing the structure of principal portions of the encoder shown in FIG. 1.

As shown in FIG. 1, a main scale 1 that is a first member is transmission-type scale composed of a transparent substrate 10 and a rectangular grating 13 formed on the substrate 10. The substrate 10 is composed of for example glass. The rectangular grating 13 is composed of light transmitting portions 11 and light non-transmitting portions 12 which are arranged at pitch P. Each of the light transmitting portions 11 and the light non-transmission portions 12 has a rectangular pattern. The light non-transmitting portions 12 are formed by vacuum-evaporating Cr on the transparent substrate 10. The light transmitting portions 11 function as signal transferring portions. The light non-transmitting portions 11 function as signal non-transferring portions. The ratio of the widths of the light transmitting portions 11 and the light non-transmitting portions 12 is not 1:1. As shown in FIG. 2, each width of the light transmitting portions in a grating direction is set to 2×P/3.

A light radiating device 2 is disposed behind the main scale 1 for radiating a collimated light 22 to the main scale 1. The light radiating device 2 is composed of an LED 20 and a collimate lens 21. The LED 20 generates a diffused light. The collimate lens 21 collimates the diffused light emitted by the LED 20 into collimated light 22.

A photodiode array 3 that is disposed in front of the main scale 1 and opposite to the light radiating device 2 with a predetermined gap. The photodiode array 3 detects the distribution of transmitted light from of the main scale 1. The photodiode array 3 is composed of a silicon substrate 30 and light receiving portions 31 formed on the substrate 30. Each of the light receiving portions 31 is a photodiode formed of PN junction. In this embodiment, the photodiode array 3 also functions as an index scale. In other words, the photodiode array 3 is disposed opposite to the main scale 1 as a second member.

The main scale 1 relatively moves against the light radiating device 2 and the photodiode array 3 as denoted by arrow x of FIG. 1. Corresponding to the relative movement of the main scale 1, the received light pattern is modulated by the photodiode array 3, which also functions as the index scale. With the geometric light that periodically varies at the scale pitch P, a displacement signal of a pseudo sine wave corresponding to the bright/dark pattern of the geometric light is obtained.

In this embodiment, as shown in FIG. 2, the photodiode array 3 having a plurality of photodiodes arranged at 3×P/4 pitch. The photodiodes are grouped into plural sets, each of which is composed of four photodiodes 31$a$, 31$bb$, 31$ab$ and 31$b$. The photodiodes 31$a$, 31$bb$, 31$ab$ and 31$b$ are 90° phase-shifted from each other with respect to the main scale 1. The Common phase outputs of the photodiode array 3 is added to generate A-, BB-, AB-, and B-phase output currents which are 90° phase-shifted in order. The output currents are converted into voltages by current-voltage converters 4$a$ to 4$d$, respectively. Thereafter, differential amplifiers 5$a$ and 5$b$ obtain the difference between the A- and AB-phase outputs, and the difference between the B- and BB-phase outputs, respectively. Thus, A- and B-phase displacement output signals that differ by 90° are obtained.

Figure 4:
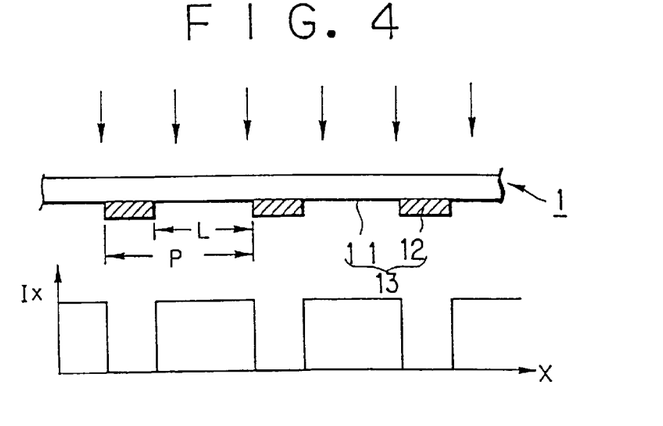
FIG. 4 is a schematic diagram showing a transmitted light pattern of a main scale of the encoder according to the embodiment.

In this embodiment, as described above, since the width of the light transmitting portions 11 of the main scale 1 is set to 2P/3. Thus, the third order harmonic component of the displacement output signal that is a pseudo sine wave is removed. Next, this theory will be described with reference to FIG. 4. Assuming that the width of the light transmitting portions 11 is denoted by L and that the transmitted light of the main scale 1 is only straightly traveling light, the transmitted light pattern is a rectangular pattern, as shown in FIG. 4. The pattern of transmitted light amount I(x) in the displacement direction x is Fourier-transformed and expressed by the following expression.

$$I(x) = C \cdot \sum_{n=1}^{\infty} \frac{1 - \cos(2n\pi L/P)}{n} \sin(2n\pi x/P) + \quad (1)$$
$$C \cdot \sum_{n=1}^{\infty} \frac{\sin(2n\pi L/P)}{n} \cos(2n\pi x/P) + D$$

In the expression (1), C and D are constants. The pattern of the transmitted light amount of the main scale 1 is modulated by the index scale on the receiving side (in this embodiment, the photodiode array 3 serves as the index scale). Thus, a pseudo sine wave output is obtained.

As is clear from the expression (1), with respect to the third order harmonic component that is the highest odd order harmonic component (namely, n=3), when L=P/3 or L=2P/3, the coefficients of the first and second terms of the right side of the expression become 0. Therefore, according to the embodiment, since L=2P/3, the third order harmonic component is removed, whereby a displacement output signal near a normal sine wave is obtained. In addition, as described with reference to FIG. 2, the DC component can be canceled with the differential amplifying process of two outputs with phases that differ by 180°.

In addition, as is clear from the expression (1), when L=P/3 or 2P/3, the term of the even order harmonic components is not removed. However, the even order harmonic components contained in the two outputs with phases that differ by 180° have the same phase. Thus, with the differential amplifying process, the even order harmonic components are also canceled.

In the expression (1), terms "A sin (2πx/P)" and "B cos (2πx/P)" are remained as fundamental components. The fundamental components are composed to become a sine wave "$(A^2+B^2)^{1/2}$ sin (2πx /P+ø)". The deviation of phase ø does not affect the measurement of the displacement in the incremental system.

In this embodiment, since the width of the light transmitting portions 11 of the main scale 1 is approximately twice the width of the light non-transmitting portions 12, in comparison with the conventional main scale of which the ratio of the widths of the light transmitting portions and the light non-transmitting portions is 1:1, the transmitted light amount of the main scale becomes large, thereby increasing the received light amount. As a result, the peak value of the received light amount increases, whereby the S/N ratio can be improved.

In addition, since the received light amount increases, the output current of the photodiode array 3 increases, whereby the response speed increases. When the bias voltage of the photodiode array 3 is raised, the response speed can be further increased. Moreover, since the width of the light transmitting portions 11 of the main scale 1 is large, when the peak value of the geometric light on the light receiving surface is compared with the peak value of the interference fringe pattern due to the diffracted light, the former is larger than the latter in comparison with the conventional system. This also improves the S/N ratio. In addition, the influence of the gap fluctuation between the main scale 1 and the photodiode array 3 decreases.

Figure 5:
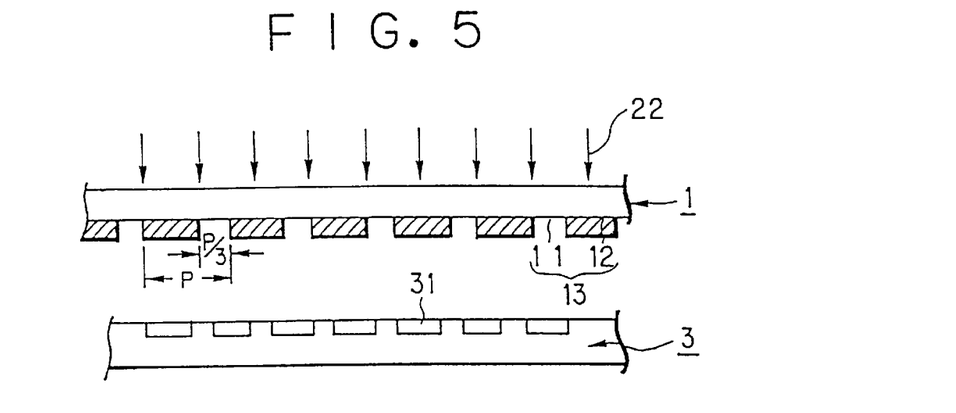
FIG. 5 is a schematic diagram showing the structure of a transmission-type encoder corresponding to another embodiment of the present invention.

FIG. 5 is a schematic diagram showing the construction of principal portions of a transmission-type encoder according to another embodiment of the present invention. For simplifying, in FIG. 5, the similar portions to those of the embodiment shown in FIG. 1 are denoted by similar reference numerals and their description will be omitted. The structure of the embodiment shown in FIG. 5 is the same as the structure of the embodiment shown in FIG. 1 except that the width of the light transmitting portions 11 of the main scale 1 is P/3, whereas the width of the light non-transmission portions 12 is 2P/3.

According to the embodiment shown in FIG. 5, although the transmitted light amount of the main scale 1 is half of that of the embodiment shown in FIG. 1 as a drawback, as is clear from the expression (1), the third order harmonic distortion can be decreased.

Figure 6:
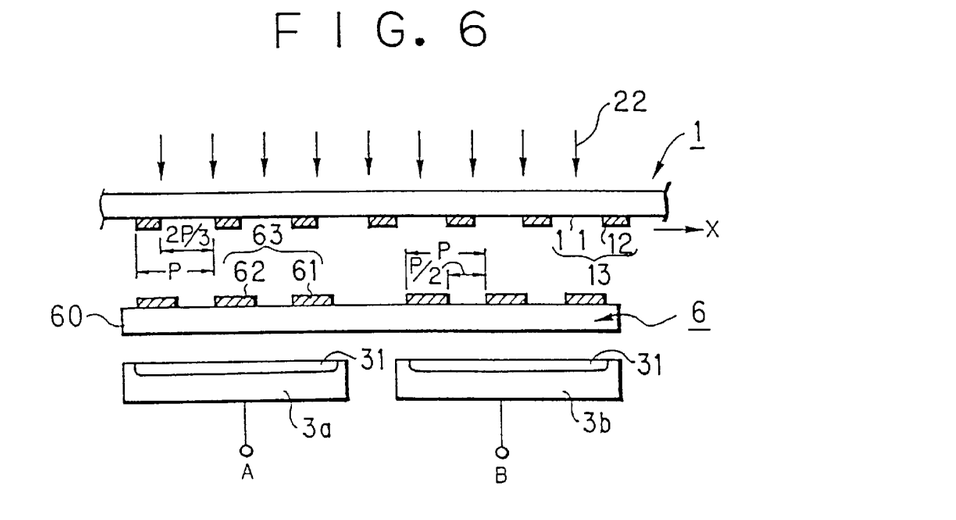
FIG. 6 is a schematic diagram showing the structure of a transmission-type encoder corresponding to another embodiment of the present invention.
Figure 7:
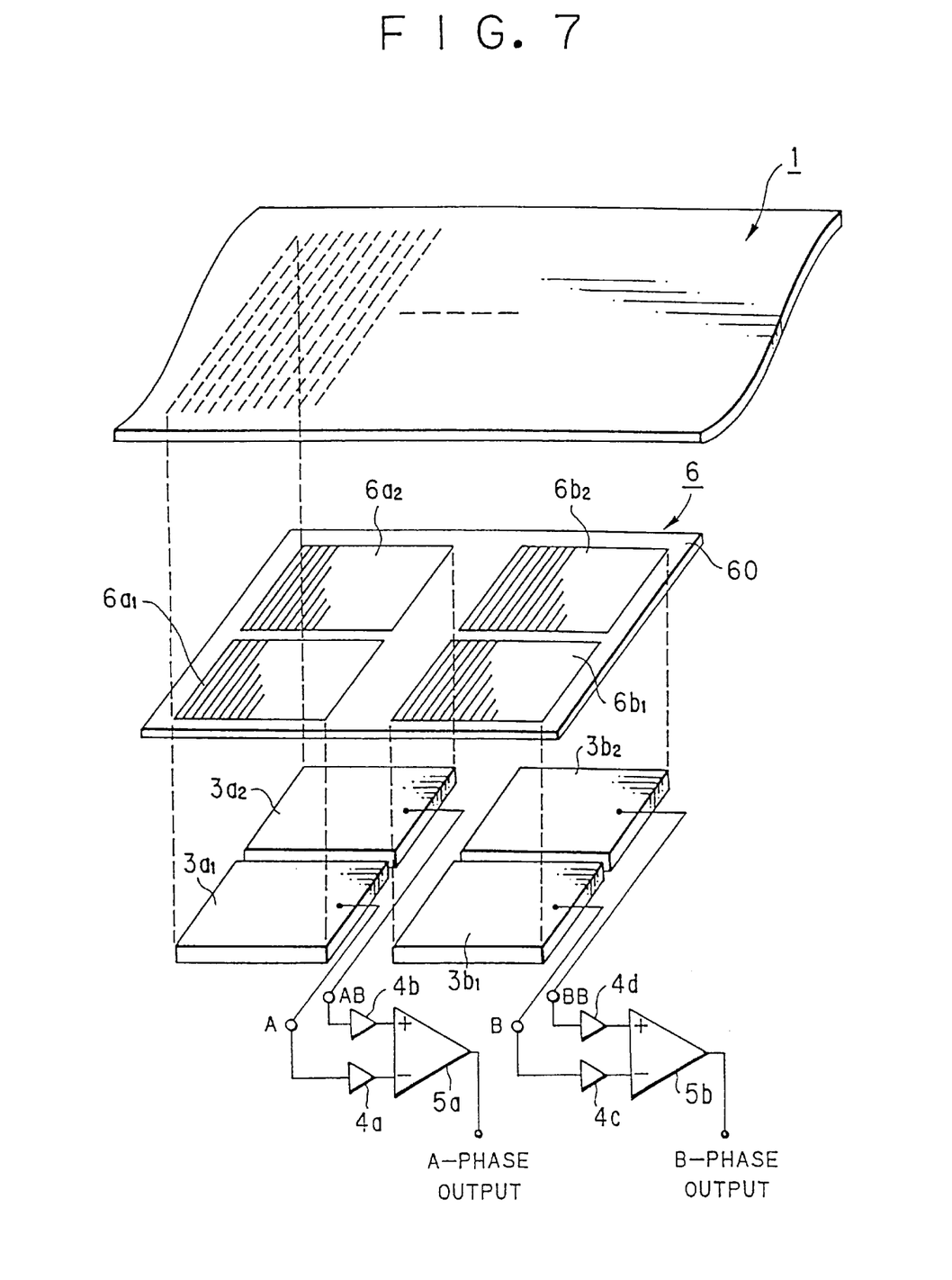
FIG. 7 is an enlarged perspective view showing the receiving portion of the encoder shown in FIG. 6.

FIG. 6 is a schematic diagram showing the structure of a transmission-type encoder according to another embodiment of the present invention. In this embodiment, a main scale 1 on which a first grating 13 is formed and an index scale 6 on which a second grating 63 are formed are disposed as a first member and a second member, respectively. The index scale 6 is disposed on the light receiving side along with light receiving devices. For simplicity, in the embodiment shown in FIG. 6, similar portions to those in the embodiment shown in FIG. 1 are denoted by similar reference numerals. The index scale 6 is a transmission-type scale which has a transparent substrate 60 such as a glass substrate and the rectangular grating 63 formed on the substrate 60. The grating 63 is composed of light transmitting portions 61 and light non-transmitting portions 62 formed in such a manner that the ratio of the widths thereof is 1:1 and the pitch thereof is P. In reality, as shown in FIG. 7, the grating 63 includes four grating portions 6a1, 6a2, 6b1 and 6b2 with phases that differ by 90° each. A-phase grating portion 6a1 and B-phase grating portion 6b1, which are 90° phase-shifted each other, are disposed in x direction. AB-phase grating portion 6a2 and BB-phase grating portion 6b2, which are 180° phase-shifted from the grating portions 6a1 and 6b1, respectively, are disposed adjacent to the grating portions 6a1 and 6b1 in the direction of the width of the scale, respectively.

Photodiodes 3a1, 3a2, 3b1 and 3b2 are disposed corresponding to the grating portions 6a1, 6a2, 6b1 and 6b2 of the index scale 6, respectively. Output currents of the photodiodes 3a1, 3a2, 3b1 and 3b2 are converted into voltages. The difference between A-phase output and AB-phase output are obtained by the differential amplifier 5a, and the difference between B-phase output and BB-phase output are obtained by the differential amplifier 5b. Thus, displacement signals with phases A and B are obtained.

In the transmission-type encoder, the width of the light transmitting portions 11 of the main scale 1 is set to 2P/3. Thus, according to the embodiment shown in FIG. 6, the same effect as the embodiment shown in FIG. 1 is obtained.

Figure 8:
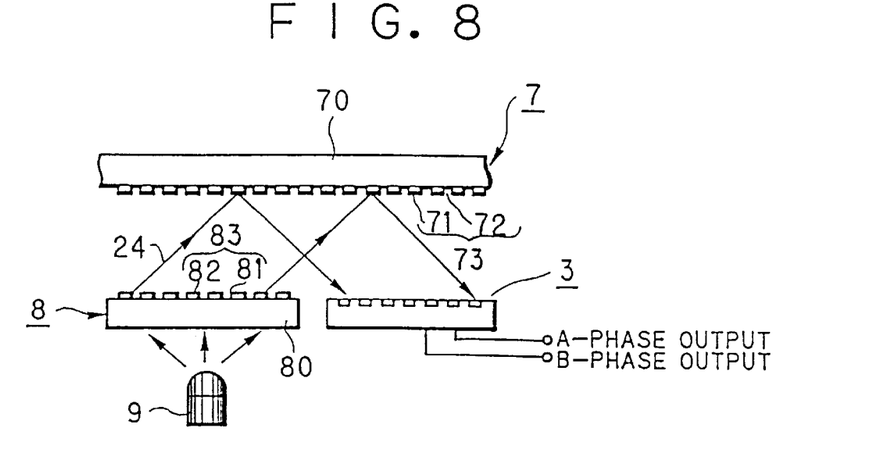
FIG. 8 is a schematic diagram showing the structure of a reflection-type encoder according to another embodiment of the present invention.
Figure 9:
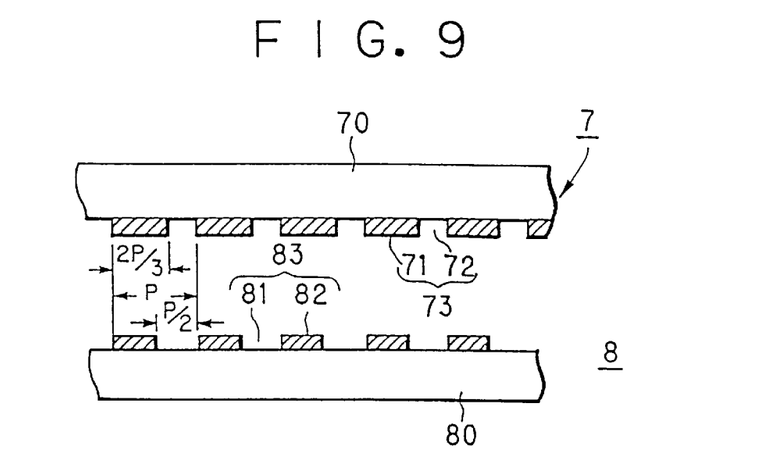
FIG. 9 is an enlarged view showing principal portions of an encoder according to the embodiment shown in FIG. 8.

FIG. 8 is a schematic diagram showing the structure of a reflection-type optical encoder according to another embodiment of the present invention. The encoder according to this embodiment is composed of a reflection-type main scale 7, a light source 9, a light source index scale 8, and a photodiode array 3. The photodiode array 3 also functions as a light receiving index scale that is the same as that in the embodiment shown in FIG. 1. The light source index scale 8 and the photodiode array 3 are disposed opposite to the main scale 7. The light source 9 is disposed at the rear of the light source index scale 8. As shown in FIG. 9, the main scale 7 is composed of a substrate 70 and a rectangular grating 73 formed on the substrate 70. The grating 73 is compose of light reflecting portions 71 and light non-reflecting portions 72 (light non-absorbing or light non-transmitting portions) alternately arranged at pitch P. Each width of the light reflecting portions 71 is set to 2×P/3. As shown in FIG. 9, the index scale 8 is such a transmission-type scale that is composed of a transparent substrate 80 and a rectangular grating 83 formed on the substrate 80. The grating 83 is composed of light transmitting portions 81 and light non-transmitting portions 82 alternately arranged at pitch P with the width ratio of 1:1.

The light source 9 is a diffusion light source such as an LED. The diffused light enters the light source index scale 8 with the light transmitting portions 81 and the light non-transmitting portions 82 disposed at pitch P. Thus, a secondary light source array, in which the transmitting portions 81 serve as point light sources arranged at pitch P, is obtained. Collimated light 24 in the predetermined direction from the secondary light source array is radiated to the main scale 7. A geometrical light pattern reflected from the main scale 7 is input to the photodiode array 3. The resultant image pattern is modulated and detected in the same manner as the embodiment shown in FIG. 1.

According to the embodiment shown in FIG. 8, the same effect as the embodiment shown in FIG. 1 can be obtained.

Figure 10:
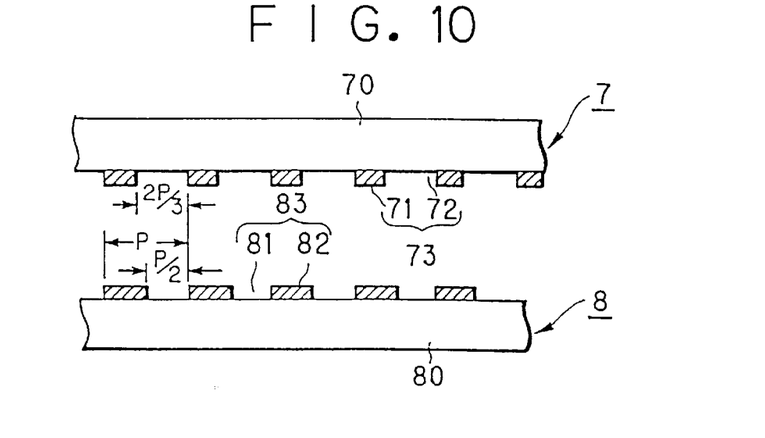
FIG. 10 is an enlarged view showing principle portions of another encoder according to the embodiment shown in FIG. 8.

Instead of FIG. 9, the reflecting-type scale 7 may be formed as shown in FIG. 10. In FIG. 10, the width of the light reflecting portions 71 of the scale 7 is set to P/3. Although the received light amount is halved, the third order harmonic distortion can be reduced as similar to the embodiment of FIG. 9.

In the above-described embodiments, the optical type encoder was described. However, the present invention can be applied to an electrostatic capacitance type encoder corresponding the same theory. In a capacitance type encoder, the variation of the capacitance coupling between signal transferring electrodes and receiving electrodes is detected corresponding to the displacement of the scale, whereby a displacement is measured. For example, a capacitance type encoder has been disclosed as Japanese Patent Laid-Open Publication 3-37517. With an arrangement of electrodes that generate the same capacitance coupling pattern as the above-described embodiments of the scale portion of the encoder, a displacement signal of a pseudo sine wave can be obtained.

In addition, the present invention can be applied to a magnetic type encoder that measures the displacement using magnetic coupling corresponding to the similar theory.

Although the present invention has been shown and described with respect to best mode embodiments thereof, it should be understood by those skilled in the art that the foregoing and various other changes, omissions, and additions in the form and detail thereof may be made therein without departing from the spirit and scope of the present invention.

What is claimed is:

1. An apparatus for measuring a displacement, comprising:
   a first member on which a first grating is formed, said first grating being composed of light transferring portions and light non-transferring portions which are alternately arranged with rectangular patterns at pitch P, each width of said light transferring portions in a direction of a grating arrangement being set to m×P/3 where m is 1 or 2);
   light radiating means for radiating a collimated light to said first member so as to obtain a rectangular transferred light pattern;
   a second member on which a second grating is formed, said second member being disposed opposite to said first member with a gap so as to be relatively movable in the direction of the grating arrangement along with said light radiating means, said second grating being composed of light transmitting portions and light non-transmitting portions which are alternately arranged with rectangular patterns so as to modulate said transferred light from said first member to output a transmitted light pattern; and
   light receiving means for receiving said transmitted light pattern from said second member and outputting a displacement output signal that varies corresponding to the relative movement of said first and second members.

2. The apparatus according to claim 1, wherein
   said first member is a transmission-type main scale in which the light transferring portions and the light non-transferring portions are light transmitting portions and light non-transmitting portions, respectively; and
   said second member is a transmission-type index scale in which the light transmitting portions and the light non-transmitting portions of said second grating are arranged with a width ratio of 1:1 at pitch P.

3. The apparatus according to claim 2, wherein
   each width of the light transmitting portions of said main scale is set to 2×P/3.

4. The apparatus according to claim 2, wherein said second grating has four grating portions with phases that differ by 90° each; and
   said light receiving means has four receiving devices disposed corresponding to the four grating portions, respectively.

5. The apparatus according to claim 2, wherein said second grating has four grating portions with phases that differ by 90° each; and said light receiving means has four receiving devices disposed corresponding to the four grating portions, respectively, and two differential circuit means for amplifying differences between the respective two 180° phase-shifted outputs of said receiving devices to generate two displacement signals which are 90° phase-shifted from each other.

6. The apparatus according to claim 1, wherein said first member is a transmission-type main scale in which the light transferring portions and the light non-transferring portions are light transmitting portions and light non-transmitting portions, respectively; and said light receiving means includes a light receiving device array which has a function of said second member.

7. The apparatus according to claim 6, wherein each width of the transmitting portions of said main scale is set to 2×P/3.

8. The apparatus according to claim 6, wherein said light receiving means includes:

a light receiving device array having a plurality of light receiving devices arranged at pitch 3×P/4, said light receiving devices being grouped into plural sets, each of sets being composed of four light receiving devices disposed adjacent each other;

adding means for adding up common phase outputs of said light receiving device array to generate added outputs with four phases; and two differential circuit means for amplifying differences between the respective two added outputs that are 180° phase-shifted from each other to generate two displacement signals with different phases by 90° each.

9. The apparatus according to claim 1, wherein said first member a reflection-type main scale in which the light transferring portions and the light non-transferring portions are light reflecting portions and light non-reflecting portions, respectively;

said light radiating means includes a light source which generates a diffused light, and an index scale on which light transmitting portions and light non-transmitting portions are alternately arranged at pitch P to receive the diffused light so as to irradiate said main scale; and said light receiving means includes a light receiving device array which has a function of said second member.

10. The apparatus according to claim 9, wherein each width of said light reflecting portions of said main scale is set to 2×P/3.

11. The apparatus according to claim 9, wherein said light receiving means includes:

a light receiving device array having a plurality of light receiving devices arranged at pitch 3×P/4, said light receiving devices being grouped into plural sets, each of sets being composed of four light receiving devices disposed adjacent each other;

adding means for adding up common phase outputs from said light receiving device array to generate added outputs with four phases; and two differential circuit means for amplifying differences between the respective two added outputs that are 180° phase-shifted each other to generate two displacement signals with different phases by 90° each.

12. An apparatus for measuring a displacement, comprising;

a scale on which a grating is formed, said grating being composed of light transferring portions and light non-transferring portions which are alternately arranged with rectangular patterns at pitch P, each width of said light transferring portions in a direction of a grating arrangement being set to m×P/3 (where m is 1 or 2);

light radiating means for radiating a collimated light to said scale so as to obtain a rectangular transferred light pattern; and a light receiving device array for receiving the transferred light pattern from said scale, said light receiving device array having a plurality of light receiving devices which are arranged at pitch 3×P/4 so as to output four phase displacement output signals.

13. An apparatus for measuring a displacement, comprising:

first and second members oppositely disposed so as to be relatively movable;

signal transferring means disposed on said first member for transferring a signal with a rectangular pattern to said second member, said signal transferring means having a rectangular grating composed of signal transferring portions and non-transferring portions alternately arranged with rectangular patterns at a pitch P, each width of said signal transferring portions in a direction of a grating arrangement being set to 2×P/3; and signal receiving means disposed on said second member for receiving a transferred signal from said first member and outputting a displacement output signal that varies corresponding to the relative movement of said first and second members.

* * * * *

UNITED STATES PATENT AND TRADEMARK OFFICE
CERTIFICATE OF CORRECTION

PATENT NO. : 5,889,280
DATED : March 30, 1999
INVENTOR(S) : Tatsuhiko Matsuura

It is certified that error appears in the above-identified patent and that said Letters Patent is hereby corrected as shown below:

Title Page, [57] ABSTRACT, line 7, "2p/3" should read --2P/3--.

Column 1 Lines 19-20 "referred to a" should read --referred to as--.

Column 1 Line 41 "are as small" should read --is as small--.

Column 1 Line 41 "It" should read --it--.

Column 1 Line 44 "ten am" should read --ten $\mu$m--.

Column 4 Line 29 "principle" should read --principal--.

Column 4 Line 66 after "array 3" delete --that--.

Column 5 Line 2 "from of the" should read --from the--.

Column 5 Line 24 "The Common" should read --The common--.

Column 5 Line 24 "is" should read --are--.

Column 5 Line 33 after "described above," delete --since--.

Column 6 Line 56 "are formed" should read --is formed--.

Column 7 Line 15 "are obtained" should read --is obtained--.

Column 7 Line 16 "are" should read --is--.

Column 7 Lines 35-36 "is compose" should read --is composed--.

UNITED STATES PATENT AND TRADEMARK OFFICE
CERTIFICATE OF CORRECTION

PATENT NO. : 5,889,280
DATED : March 30, 1999
INVENTOR(S) : Tatsuhiko Matsuura

It is certified that error appears in the above-identified patent and that said Letters Patent is hereby corrected as shown below:

Column 8 Line 2 after "corresponding" insert --to--.

Column 8 Line 30 Claim 1 before "where" insert --(--.

Column 9 Line 37 Claim 9 after "member" insert --is--.

Column 10 Line 13 after "phase-shifted" insert --from--.

Column 10 Line 16 Claim 12 after "comprising" delete semicolon and insert colon --:--.

Signed and Sealed this

Twenty-eighth Day of September, 1999

Q. TODD DICKINSON

*Attest:*

*Attesting Officer*   *Acting Commissioner of Patents and Trademarks*